United States Patent
Jin

(10) Patent No.: US 11,437,546 B2
(45) Date of Patent: Sep. 6, 2022

(54) DISPLAY PANEL AND DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventor: Jiangjiang Jin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 292 days.

(21) Appl. No.: 16/605,552

(22) PCT Filed: Sep. 18, 2019

(86) PCT No.: PCT/CN2019/106482
§ 371 (c)(1),
(2) Date: Oct. 16, 2019

(87) PCT Pub. No.: WO2020/248419
PCT Pub. Date: Dec. 17, 2020

(65) Prior Publication Data
US 2021/0408334 A1    Dec. 30, 2021

(30) Foreign Application Priority Data
Jun. 12, 2019 (CN) .......................... 201910506268.5

(51) Int. Cl.
*H01L 33/38* (2010.01)
*H01L 27/15* (2006.01)
*H01L 33/58* (2010.01)

(52) U.S. Cl.
CPC .......... *H01L 33/382* (2013.01); *H01L 27/156* (2013.01); *H01L 33/58* (2013.01)

(58) Field of Classification Search
CPC ..... H01L 33/382; H01L 27/156; H01L 33/58; H01L 27/3276; H01L 51/5212; H01L 51/5218; H01L 51/5253; H01L 27/3223; H01L 27/153; H01L 27/3244; H01L 33/36; H01L 33/48; H01L 51/5206; H01L 51/525
See application file for complete search history.

(56) References Cited

U.S. PATENT DOCUMENTS

2017/0331058 A1* 11/2017 Seo ..................... H01L 51/5293

FOREIGN PATENT DOCUMENTS

| CN | 207441754 U | 6/2018 |
| CN | 108987443 A | 12/2018 |
| CN | 208738307 U | 4/2019 |
| JP | 2010272471 A | 12/2010 |

* cited by examiner

*Primary Examiner* — Su C Kim

(57) ABSTRACT

The present invention provides a display panel and a display module, and the display panel includes: an array substrate; a light emitting device layer on the array substrate, including an anode layer on the array substrate, the anode layer including at least one metal layer; The display panel further includes at least one retaining wall on the array substrate; a distance between an edge of the at least one metal layer in the anode layer and a first boundary of the display panel is greater than a distance between the retaining wall and the first boundary.

11 Claims, 2 Drawing Sheets

DISPLAY PANEL AND DISPLAY MODULE

BACKGROUND OF INVENTION

Field of Invention

The present invention relates to a field of display, and in particular, to a display panel and a display module.

Description of Prior Art

An encapsulation layer of an existing display panel is usually composed of a stack of inorganic/organic layers, and the organic layer is generally thicker in order to prevent penetration of water and oxygen into an interior of the display panel. Since the organic layer has a certain degree of fluidity, an edge region of the existing display panel is provided with a retaining wall to prevent the organic layer from overflowing.

When the display panel is in a high temperature and high humidity environment, characteristics of layers in the display panel may change. In addition, due to the existence of the retaining wall, the stress concentration in the region is likely to cause peeling of the layers, so that the water and oxygen in the atmosphere penetrates into the interior of the layers, resulting in failure of a signal trace inside the panel, resulting abnormalities.

Therefore, there is a need for a display panel to solve the above technical problems.

SUMMARY OF INVENTION

The present invention provides a display panel and a display module to solve the technical problems that the signal trace inside the existing display panel is prone to failure.

To solve the above problems, technical solutions provided by the present invention are as follows:

The present invention provides a display panel including: an array substrate; a light emitting device layer disposed on the array substrate, including an anode layer on the array substrate, the anode layer including at least one metal layer; and at least one retaining wall on the array substrate, wherein in a first direction, a distance between an edge of the at least one metal layer of the anode layer and a first boundary of the display panel is greater than a distance between the retaining wall and the first boundary.

In the display panel of the present invention, the display panel includes a display area and a non-display area located at a periphery of the display area, the anode layer extends from the display area of the display panel to the non-display area of the display panel, the retaining wall is located in the non-display area, and the least one metal layer of the anode layer extending into the non-display area is arranged not beyond the retaining wall.

In the display panel of the present invention, the display panel includes a first retaining wall and a second retaining wall, the first retaining wall is disposed close to the display area, the second retaining wall is disposed away from the display area, and the least one metal layer of the anode layer extending into the non-display area is arranged not beyond the first retaining wall.

In the display panel of the present invention, the anode layer includes a first metal layer, a second metal layer and a third metal layer which are stacked, the first metal layer is located on the array substrate, the second metal layer is located on the first metal layer, the third metal layer is located on the second metal layer, and in a first direction, a distance between the first boundary and an edge of at least one of the first metal layer, the second metal layer, and the third metal layer is greater than a distance between the first boundary and the retaining wall.

In the display panel of the present invention, in a first direction, a distance between the first boundary and an edge of the second metal layer and the first boundary is greater than a distance between the first boundary and the first retaining wall, and an orthographic projection of the first retaining wall on the first metal layer does not overlap with the first metal layer.

In the display panel of the present invention, a distance between each of the first boundary and an edge of each of the first metal layer and the third metal layer is less than a distance between an edge of the first boundary and the second metal layer, wherein the third metal layer covers the second metal layer.

In the display panel of the present invention, in a first direction, the distance between the first boundary and an edge of each of the first metal layer and the third metal layer and the first boundary is greater than a distance between the first boundary and the first retaining wall, an orthographic projection of the first retaining wall on the first metal layer does not overlap with the third metal layer, and an orthographic projection of the first retaining wall on the third metal layer does not overlap with the third metal layer.

In the display panel of the present invention, in a first direction, a distance between the first boundary and an edge of each of the first metal layer and the third metal layer is less than a distance between the first boundary and the first retaining wall, an orthographic projection of the first retaining wall on the first metal layer overlaps with the third metal layer, and an orthographic projection of the first retaining wall on the third metal layer overlaps with the third metal layer.

In the display panel of the present invention, a height of the first retaining wall is less than a height of the second retaining wall.

The present invention also provides a display module, wherein the display module includes a display panel and a polarizer layer and a cover plate layer on the display panel; and the display panel includes: an array substrate; a light emitting device layer disposed on the array substrate, including an anode layer on the array substrate, the anode layer including at least one metal layer; and at least one retaining wall on the array substrate, wherein in a first direction, a distance between an edge of the at least one metal layer of the anode layer and a first boundary of the display panel is greater than a distance between the retaining wall and the first boundary.

In the display module of the present invention, the display panel includes a display area and a non-display area located at a periphery of the display area, the anode layer extends from the display area of the display panel to a non-display area of the display panel, the retaining wall is located in the non-display area, and the least one metal layer of the anode layer extending into the non-display area is arranged not beyond the retaining wall.

In the display module of the present invention, the display panel includes a first retaining wall and a second retaining wall, the first retaining wall is disposed close to the display area, the second retaining wall is disposed away from the display area, and the least one metal layer of the anode layer extending the non-display area is arranged not beyond the first retaining wall.

In the display module of the present invention, the anode layer includes a first metal layer, a second metal layer and a third metal layer which are stacked, the first metal layer is located on the array substrate, the second metal layer is located on the first metal layer, the third metal layer is located on the second metal layer, and in a first direction, a distance between the first boundary and an edge of at least one of the first metal layer, the second metal layer, and the third metal layer is greater than a distance between the first boundary and the retaining wall.

In the display module of the present invention, in a first direction, a distance between the first boundary and an edge of the second metal layer is greater than a distance between the first boundary and the first retaining wall, and an orthographic projection of the first retaining wall on the first metal layer does not overlap with the first metal layer.

In the display module of the present invention, a distance between the first boundary and each of an edge of the first metal layer and the third metal layer is less than a distance between the first boundary and an edge of the second metal layer, wherein the third metal layer covers the second metal layer.

In the display module of the present invention, in a first direction, the distance between the first boundary and an edge of each of the first metal layer and the third metal layer is greater than a distance between the first boundary and the first retaining wall, an orthographic projection of the first retaining wall on the first metal layer does not overlap with the third metal layer, and an orthographic projection of the first retaining wall on the third metal layer does not overlap with the third metal layer.

In the display module of the present invention, in a first direction, a distance between the first boundary and an edge of each of the first metal layer and the third metal layer is less than a distance between the first boundary and the first retaining wall, an orthographic projection of the first retaining wall on the first metal layer overlaps with the third metal layer, and an orthographic projection of the first retaining wall on the third metal layer overlaps with the third metal layer.

In the display module of the present invention, a height of the first retaining wall is less than a height of the second retaining wall.

In the display module of the present invention, a height of the first retaining wall is great than a height of the second retaining wall.

Advantageous effects: the present invention places the anode layer under the retaining wall away from the retaining wall to prevent water and oxygen from entering the interior of the display panel from the retaining wall region when a layer structure of the retaining wall region changes, which may result in a failure of the anode layer, thus reducing product reliability.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Figure 1:
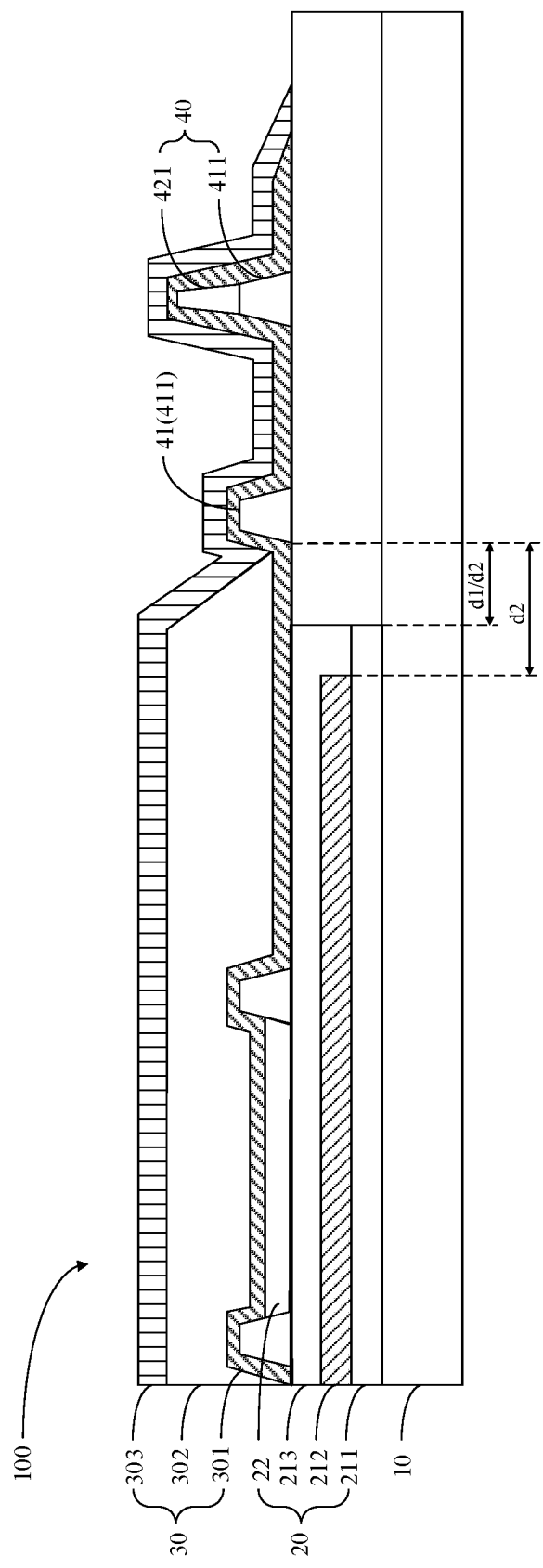
FIG. 1 is a schematic diagram showing a first structure of a display panel according to the present invention.

Please refer to FIG. 1. FIG. 1 is a schematic diagram showing a first structure of a display panel according to the present invention.

The display panel 100 includes an array substrate 10, a light emitting device layer 20 on the array substrate 10, and a thin film encapsulation layer 30 on the light emitting device layer 20.

The array substrate 10 includes a substrate and a thin film transistor layer on the substrate.

The substrate may be made of one of a glass substrate, a quartz substrate, a resin substrate, and the like. When the substrate is a flexible substrate, the flexible substrate may be made of polyimide (PI).

The thin film transistor layer includes a plurality of thin film transistor units. The thin film transistor unit may be an etching retaining layer type, a back-channel etching type or a top gate thin film transistor type, etc., which is not particularly limited in this embodiment.

The present invention is described by taking a top gate thin film transistor type as an example.

For example, the thin film transistor unit may include a light shielding layer, a buffer layer, an active layer, a gate insulating layer, a gate electrode, an interlayer insulating layer, a source drain, a passivation layer, and a planarization layer.

The light emitting device layer 20 includes an anode layer 21, a cathode layer, and a light emitting layer 22 between the anode layer 21 and the cathode layer.

The anode layer 21 is located on the planarization layer.

The anode layer 21 includes at least one metal layer.

Referring to FIG. 1, the display panel 100 further includes at least one retaining wall 40 on the array substrate 10. In a first direction, a distance between an edge of the at least one metal layer of the anode layer and a first boundary of the display panel 100 is greater than a distance between the retaining wall 40 and the first boundary.

In the display panel 100 of the present invention, the display panel 100 includes a display area 200 and a non-display area 300 located at a periphery of the display area 200.

The retaining wall 40 is located in the non-display area 300 of the display panel 100. The anode layer 21 extends from the display area 200 of the display panel 100 to the non-display area 300 of the display panel 100. The least one metal layer of the anode layer 21 extending into the non-display area 300 is arranged not beyond the retaining wall 40.

In this embodiment, the display panel 100 may include a first retaining wall 41 and a second retaining wall 42.

The first retaining wall 41 is disposed close to the display area 200, and the second retaining wall 42 is disposed away from the display area 200.

In this embodiment, a height of the first retaining wall 41 may be less than a height of the second retaining wall 42.

In this embodiment, the first retaining wall 41 includes a first layer 411.

In this embodiment, the second retaining wall 42 includes the first layer 411 and a second layer 421 which are stacked. The first layer 411 and the second layer 421 are formed in different mask processes.

In this embodiment, the material of the first layer 411 may be the same as the material of the planarization layer, and the material of the second layer 421 may be the same as the material of the pixel defining layer.

In this embodiment, the material of the first layer 411 and the second layer 421 may be an organic material.

In this embodiment, the anode layer 21 may include a first metal layer 211, a second metal layer 212, and a third metal layer 213 which are stacked. The first metal layer 211 is located on the array substrate 10. The second metal layer 212 is located on the first metal layer 211. The third metal layer 213 is located on the second metal layer 212.

In a first direction, a distance between an edge of at least one of the first metal layer 211, the second metal layer 212, and the third metal layer 213 and the first boundary is greater than a distance between the first retaining wall 41 and the first boundary.

Referring to FIG. 1, a distance between the second metal layer 212 and the first retaining wall 41 in the first direction is d2, which is greater than a distance between the first retaining wall 41 and the first boundary. An orthographic projection of the first retaining wall 41 on the first metal layer 211 does not overlap with the first metal layer 211.

In this embodiment, the first direction may be a direction parallel to a long side of the display panel 100 or a direction parallel to a short side of the display panel 100.

In this embodiment, the distance d2 between the second metal layer 212 and the first retaining wall 41 in the first direction is a distance between a boundary of an edge region of the display panel 100 close to the second metal layer 212 and a boundary of the display area 200 of the display panel 100 close to the first retaining wall 41.

A distance between the edges of the first metal layer 211 and the third metal layer 213 and the first boundary is less than a distance between the edge of the second metal layer 212 and the first boundary. A distance between the first metal layer 211 and the third metal layer 213 and the edge region of the display panel 100 is greater than a distance between the first retaining wall 41 and the edge region of the display panel 100.

An orthographic projection of the first retaining wall 41 on the first metal layer 211 does not overlap with the third metal layer 213, and an orthographic projection of the first retaining wall 41 on the third metal layer 213 does not overlap with the third metal layer 213.

A distance d1 between the first metal layer 211 and the first retaining wall 41 in the first direction and a distance d3 between the third metal layer 213 and the first retaining wall 41 in the first direction are greater than the distance between the first retaining wall 41 and the first boundary.

In this embodiment, the third metal layer 213 covers the second metal layer 212.

In this embodiment, d1 may be equal to d3.

In this embodiment, d1 is larger than d3.

Figure 2:
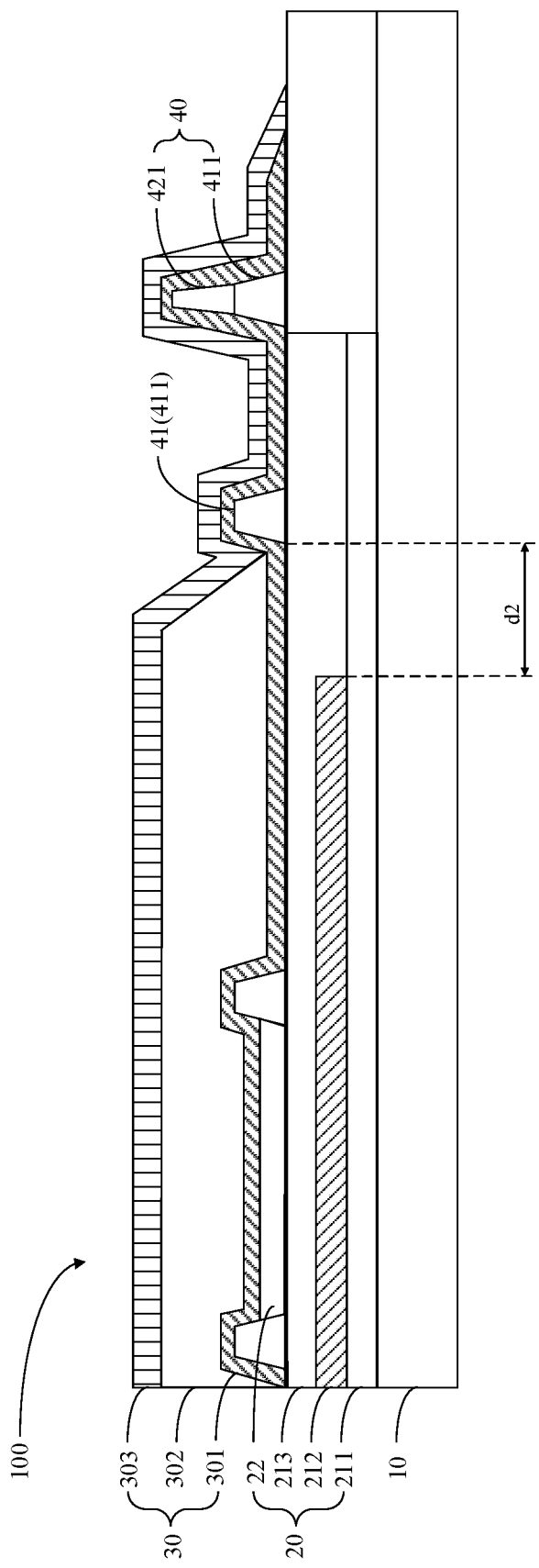
FIG. 2 is a schematic diagram showing a second structure of a display panel according to the present invention.

Please refer to FIG. 2. FIG. 2 is a schematic diagram showing a second structure of a display panel 100 according to the present invention.

A distance between a second metal layer 212 and a first retaining wall 41 in a first direction is d2, which is greater than a distance between the first retaining wall 41 and a first boundary. An orthographic projection of the first retaining wall 41 on the first metal layer 211 does not overlap with the first metal layer 211.

In this embodiment, the first metal layer 211 and the third metal layer 213 extend from the display region 200 to the non-display region 300 and beyond the first retaining wall 41.

A distance between edges of the first metal layer 211 and the third metal layer 213 and the first boundary is less than a distance between the first retaining wall 41 and the first boundary.

An orthographic projection of the first retaining wall 41 on the first metal layer 211 overlaps with the third metal layer 213, and an orthographic projection of the first retaining wall 41 on the third metal layer 213 overlaps with the third metal layer 213.

In FIGS. 1 and 2, the material of the first metal layer 211 may include but is not limited to indium tin oxide. The material of the second metal layer 212 may include, but is not limited to, silver. The material of the third metal layer 213 may include, but is not limited to, indium tin oxide.

In FIGS. 1 and 2, at least one metal layer of the anode layer 21 is spaced apart from the retaining wall 40 by a distance of more than 20 micrometers in the first direction.

Referring to FIG. 1 or FIG. 2, the thin film encapsulation layer 30 is mainly configured to block water and oxygen, and prevent external water vapor from eroding an organic light-emitting layer. The thin film encapsulation layer 30 may be formed by alternately laminating at least one organic layer and at least one inorganic layer. The organic layer is usually located in a middle of the thin film encapsulation layer 30, and the inorganic layer is located on both sides of the thin film encapsulation layer 30 to wrap the organic layer in the middle.

In this embodiment, the thin film encapsulation layer 30 includes a first inorganic layer 301, a first organic layer 302 on the first inorganic layer 301, and a second inorganic layer 303 on the first organic layer 302.

In this embodiment, the thin film encapsulation layer 30 covers the first retaining wall 41 and the second retaining wall 42. The first organic layer 302 is blocked by the first retaining wall 41 on a side of the first retaining wall 41 close to the display area 200.

In this embodiment, since the organic layer in the thin film encapsulation layer 30 is composed of an organic material having fluidity, in order to prevent overflow of the organic layer, a sum of the thicknesses of the first inorganic layer 301 and the first organic layer 302 is less than a thickness of the second retaining wall 42.

In this embodiment, the second inorganic layer 303 covers the first organic layer 302, and a boundary of the second inorganic layer 303 is beyond a boundary of the first inorganic layer 301.

Since the organic layer in the thin film encapsulation layer 30 is easily irreversibly changed in a high temperature environment to cause failure, a function of blocking water oxygen may be lost.

In addition, since a thickness of the second retaining wall 42 is greater than a thickness of the first retaining wall 41, a degree of stress concentration in the second retaining wall 42 is greater than that in the first retaining wall 41, so that the second retaining wall 42 is prone to peeling, and water and oxygen may enter an interior of the display panel 100 from the second retaining wall 42. Therefore, the anode layer 21 of the present invention is not located beyond the second retaining wall 42.

Compared with other flat regions, the first retaining wall 41 is also more likely to cause film peeling, and the second metal layer 212 in the anode layer 21 serves as a main metal layer for transmitting signals. Therefore, in the present invention, it is required to ensure that the second metal layer 212 has a spacing of at least 20 microns apart from the first retaining wall 41 to avoid failure of signal traces inside the panel, which may result in abnormalities.

The present invention also provides a display module, which includes the above display panel. The display module further includes a polarizer layer, and a cover layer etc. on the display panel. A working principle of the display module is the same as or similar to that of the display panel.

The present invention also proposes an electronic device including the above display module. The electronic device includes, but is not limited to, a mobile phone, a tablet computer, a computer display, a game machine, a television, a display screen, a wearable device, and other living appliances or household appliances having display functions. A working principle of the electronic device is the same as or similar to that of the display module, and details are not described herein for brevity.

The present invention provides a display panel and a display module, the display panel includes: an array substrate; a light emitting device layer on the array substrate, including an anode layer on the array substrate, the anode layer including at least one metal layer; The display panel further includes at least one retaining wall on the array substrate; a distance between an edge of the at least one metal layer of the anode layer and a first boundary of the display panel is greater than a distance between the retaining wall and the first boundary. In the present invention, the anode layer located under the retaining wall is disposed away from the retaining wall, to prevent water and oxygen from entering the interior of the display panel from the retaining wall region when a layer structure of the retaining wall region changes, which may result in a failure of the anode layer, thus reducing product reliability.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising:
an array substrate;
a light emitting device layer disposed on the array substrate, comprising an anode layer on the array substrate, the anode layer comprising at least one metal layer; and
at least one retaining wall on the array substrate, wherein
in a first direction, a distance between an edge of the at least one metal layer of the anode layer and a first boundary of the display panel is greater than a distance between the retaining wall and the first boundary;
the display panel comprises a display area and a non-display area located at a periphery of the display area;
the anode layer extends from the display area of the display panel to the non-display area of the display panel;
the retaining wall is located in the non-display area;
the least one metal layer of the anode layer extending into the non-display area is arranged not beyond the retaining wall;
the display panel comprises a first retaining wall and a second retaining wall;
the first retaining wall is disposed close to the display area;
the second retaining wall is disposed away from the display area;
the least one metal layer of the anode layer extending into the non-display area is arranged not beyond the first retaining wall;
the anode layer comprises a first metal layer, a second metal layer and a third metal layer which are stacked;
the first metal layer is located on the array substrate;
the second metal layer is located on the first metal layer;
the third metal layer is located on the second metal layer;
in a first direction, a distance between the first boundary and an edge of at least one of the first metal layer, the second metal layer, and the third metal layer is greater than a distance between the first boundary and the retaining wall;
in a first direction, a distance between the first boundary and an edge of the second metal layer and the first boundary is greater than a distance between the first boundary and the first retaining wall;
an orthographic projection of the first retaining wall on the first metal layer does not overlap with the first metal layer;
a distance between each of the first boundary and an edge of each of the first metal layer and the third metal layer is less than a distance between an edge of the first boundary and the second metal layer; and
the third metal layer covers the second metal layer.

2. The display panel according to claim 1, wherein
in a first direction, the distance between the first boundary and an edge of each of the first metal layer and the third metal layer and the first boundary is greater than a distance between the first boundary and the first retaining wall,
an orthographic projection of the first retaining wall on the first metal layer does not overlap with the third metal layer, and
an orthographic projection of the first retaining wall on the third metal layer does not overlap with the third metal layer.

3. The display panel according to claim 1, wherein
in a first direction, a distance between the first boundary and an edge of each of the first metal layer and the third metal layer is less than a distance between the first boundary and the first retaining wall,
an orthographic projection of the first retaining wall on the first metal layer overlaps with the third metal layer, and
an orthographic projection of the first retaining wall on the third metal layer overlaps with the third metal layer.

4. The display panel according to claim 1, wherein
a height of the first retaining wall is less than a height of the second retaining wall.

5. The display panel according to claim 1, wherein
a height of the first retaining wall is great than a height of the second retaining wall.

6. A display module, wherein the display module comprises a display panel and a polarizer layer and a cover plate layer on the display panel; and
the display panel comprises:

an array substrate;

a light emitting device layer disposed on the array substrate, comprising an anode layer on the array substrate, the anode layer comprising at least one metal layer; and at least one retaining wall on the array substrate, wherein in a first direction, a distance between an edge of the at least one metal layer of the anode layer and a first boundary of the display panel is greater than a distance between the retaining wall and the first boundary;

the display panel comprises a display area and a non-display area located at a periphery of the display area;

the anode layer extends from the display area of the display panel to a non-display area of the display panel, the retaining wall is located in the non-display area;

the least one metal layer of the anode layer extending into the non-display area is arranged not beyond the retaining wall;

the display panel comprises a first retaining wall and a second retaining wall;

the first retaining wall is disposed close to the display area;

the second retaining wall is disposed away from the display area;

the least one metal layer of the anode layer extending the non-display area is arranged not beyond the first retaining wall;

the anode layer comprises a first metal layer, a second metal layer and a third metal layer which are stacked;

the first metal layer is located on the array substrate;

the second metal layer is located on the first metal layer;

the third metal layer is located on the second metal layer;

in a first direction, a distance between the first boundary and an edge of at least one of the first metal layer, the second metal layer, and the third metal layer is greater than a distance between the first boundary and the retaining wall;

in a first direction, a distance between the first boundary and an edge of the second metal layer is greater than a distance between the first boundary and the first retaining wall; and an orthographic projection of the first retaining wall on the first metal layer does not overlap with the first metal layer.

7. The display module according to claim 6, wherein a distance between the first boundary and each of an edge of the first metal layer and the third metal layer is less than a distance between the first boundary and an edge of the second metal layer, wherein the third metal layer covers the second metal layer.

8. The display module according to claim 6, wherein in a first direction, the distance between the first boundary and an edge of each of the first metal layer and the third metal layer is greater than a distance between the first boundary and the first retaining wall, an orthographic projection of the first retaining wall on the first metal layer does not overlap with the third metal layer, and an orthographic projection of the first retaining wall on the third metal layer does not overlap with the third metal layer.

9. The display module according to claim 6, wherein in a first direction, a distance between the first boundary and an edge of each of the first metal layer and the third metal layer is less than a distance between the first boundary and the first retaining wall, an orthographic projection of the first retaining wall on the first metal layer overlaps with the third metal layer, and an orthographic projection of the first retaining wall on the third metal layer overlaps with the third metal layer.

10. The display module according to claim 6, wherein a height of the first retaining wall is less than a height of the second retaining wall.

11. The display module according to claim 6, wherein a height of the first retaining wall is great than a height of the second retaining wall.

* * * * *